United States Patent
Dehe et al.

(10) Patent No.: US 10,684,163 B2
(45) Date of Patent: Jun. 16, 2020

(54) ACOUSTIC WAVE SENSOR

(71) Applicant: Infineon Technologies AG, Neubiberg (DE)

(72) Inventors: Alfons Dehe, Reutlingen (DE); Manuel Dorfmeister, Vienna (AT); Ulrich Schmid, Vienna (AT); Michael Schneider, Vienna (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 139 days.

(21) Appl. No.: 15/679,162

(22) Filed: Aug. 17, 2017

(65) Prior Publication Data
US 2018/0052042 A1    Feb. 22, 2018

(30) Foreign Application Priority Data
Aug. 17, 2016   (DE) .................. 10 2016 115 260

(51) Int. Cl.
| | | |
|---|---|---|
| G01H 11/08 | (2006.01) | |
| H04R 17/02 | (2006.01) | |
| H04R 31/00 | (2006.01) | |
| H01L 41/083 | (2006.01) | |

(52) U.S. Cl.
CPC ......... *G01H 11/08* (2013.01); *H01L 41/0836* (2013.01); *H04R 17/025* (2013.01); *H04R 31/00* (2013.01)

(58) Field of Classification Search
CPC . G01H 11/08; H01L 41/0836; H01L 41/1132; H01L 41/0825; H01L 41/09; H04R 17/025
See application file for complete search history.

(56) References Cited

U.S. PATENT DOCUMENTS

| | | | |
|---|---|---|---|
| 2,875,355 A | | 2/1959 | Petermann |
| 4,586,512 A | | 5/1986 | Do-huu et al. |
| 4,888,861 A | * | 12/1989 | Day ..................... B06B 1/0625 |
| | | | 29/25.35 |
| 5,545,461 A | * | 8/1996 | Takeuchi ............. B41J 2/14233 |
| | | | 156/89.11 |

(Continued)

FOREIGN PATENT DOCUMENTS

| | | |
|---|---|---|
| CN | 1964581 A | 5/2007 |
| CN | 101192644 A | 6/2008 |

(Continued)

OTHER PUBLICATIONS

Chinese Office Action including Chinese Search Report issued for corresponding application No. 201710707737.0, dated Jul. 30, 2019, and Jul. 25, 2019, 9 pages (for informational purpose only).

*Primary Examiner* — Helen C Kwok
(74) *Attorney, Agent, or Firm* — Viering, Jentschura & Partner MBB

(57) ABSTRACT

An acoustic wave sensor may include: a continuous membrane deflectable by acoustic waves to be detected, and a piezoelectric layer provided on the membrane and including a plurality of piezoelectric layer portions respectively equipped with at least two individual electric contact structures configured to electrically connect the respective piezoelectric layer portions. Electric contact structures associated with different piezoelectric layer portions may be separated from each other.

21 Claims, 9 Drawing Sheets

(56) References Cited

U.S. PATENT DOCUMENTS

| | | | | |
|---|---|---|---|---|
| 5,767,612 A * | 6/1998 | Takeuchi | ................. | B41J 2/161 310/324 |
| 5,852,229 A * | 12/1998 | Josse | .................... | G01N 29/022 73/24.06 |
| 5,932,953 A * | 8/1999 | Drees | .................. | G01N 29/022 310/312 |
| 5,997,671 A * | 12/1999 | Takeuchi | ................ | B32B 18/00 156/256 |
| 8,210,027 B2 * | 7/2012 | Goel | ...................... | G01H 13/00 73/24.06 |
| 8,525,619 B1 | 9/2013 | Olsson | ............... | H03H 9/02228 310/324 |
| 8,723,399 B2 * | 5/2014 | Sammoura | ........... | B06B 1/0292 310/320 |
| 2006/0113879 A1 * | 6/2006 | Ren | ....................... | H04R 17/00 310/366 |
| 2006/0284516 A1 * | 12/2006 | Shimaoka | .............. | H04R 19/04 310/322 |
| 2007/0079656 A1 * | 4/2007 | Cook | .................. | G01P 15/0975 73/514.34 |
| 2008/0122317 A1 * | 5/2008 | Fazzio | .................. | G01H 11/08 310/328 |
| 2008/0122320 A1 * | 5/2008 | Fazzio | .................. | G01H 11/08 310/366 |
| 2008/0163694 A1 * | 7/2008 | Haskell | ................ | G01N 29/022 73/652 |
| 2009/0302716 A1 * | 12/2009 | Ohara | .................... | H01L 41/047 310/363 |
| 2010/0086151 A1 | 4/2010 | Ruiter | | |
| 2010/0219910 A1 * | 9/2010 | Yamada | .............. | H03H 9/14547 333/193 |
| 2012/0025337 A1 * | 2/2012 | Leclair | .................. | B81B 7/0048 257/419 |
| 2012/0245408 A1 * | 9/2012 | Shen | ..................... | B06B 1/0223 600/25 |
| 2012/0294119 A1 * | 11/2012 | Nikolovski | .............. | G01V 1/18 367/127 |
| 2013/0043766 A1 * | 2/2013 | Takahashi | ................ | H04R 7/20 310/326 |
| 2013/0121509 A1 * | 5/2013 | Hsu | ...................... | H04R 19/005 381/104 |
| 2014/0177881 A1 * | 6/2014 | Fanget | ................... | H04R 3/002 381/190 |
| 2016/0107194 A1 * | 4/2016 | Panchawagh | ........... | G06F 3/043 367/140 |
| 2016/0131481 A1 * | 5/2016 | Luo | .................... | G01C 19/5698 73/504.12 |
| 2017/0368574 A1 * | 12/2017 | Sammoura | ........... | B06B 1/0603 |
| 2018/0304309 A1 * | 10/2018 | Tan | ....................... | B06B 1/0603 |

FOREIGN PATENT DOCUMENTS

| | | |
|---|---|---|
| CN | 101385390 A | 3/2009 |
| CN | 104204844 A | 12/2014 |
| DE | 2901231 A1 | 7/1980 |
| JP | S62271600 A | 11/1987 |

* cited by examiner

ACOUSTIC WAVE SENSOR

CROSS-REFERENCE TO RELATED APPLICATION

This application claims priority to German Patent Application Serial No. 10 2016 115 260.9, which was filed Aug. 17, 2016, and is incorporated herein by reference in its entirety.

TECHNICAL FIELD

Various embodiments relate generally to an acoustic wave sensor, and to a method of manufacturing an acoustic wave sensor.

BACKGROUND

Acoustic wave sensors have gained significant importance in modern life, either as part of a voice transmission device or of a photoacoustic sensor employed in a gas analyzer for analyzing gases such as ambient air.

Commonly used acoustic wave sensors are configured as capacitive sensors having two membranes spaced apart from each other and defining a capacitor therebetween. One of the membranes is fixed and the respective other one is displaceable by the acoustic waves to be detected. A displacement of the displaceable membrane is indicative of characteristics of the acoustic waves to be detected and induces a change of the capacitance of the capacitor that can be detected by a suitable read-out circuit providing an electric signal indicative of characteristics of the acoustic waves to be detected such as of the acoustic pressure.

Although capacitive acoustic wave sensors achieve high sensitivities, they have several drawbacks mainly arising from their complex structure.

The drawbacks of commonly used capacitive acoustic wave sensors regarding their complex structure can be overcome by piezoelectric acoustic wave sensors. This kind of sensors employ a thin film made of a piezoelectric material deflectable by acoustic waves to be detected. A deflection of the piezoelectric film induces a voltage in the piezoelectric film that can be detected by a suitable read-out circuit providing an electric signal indicative of characteristics of the acoustic waves to be detected.

Although piezoelectric acoustic wave sensors may be provided with a simpler structure as compared to capacitive acoustic wave sensors, they suffer from lower sensitivities as compared to capacitive acoustic wave sensors.

SUMMARY

According to various embodiments, an acoustic wave sensor is provided. The acoustic wave sensor may include a continuous membrane deflectable by acoustic waves to be detected, and a piezoelectric layer provided on the membrane and including a plurality of piezoelectric layer portions respectively equipped with at least two individual electric contact structures configured to electrically connect the respective piezoelectric layer portions. Electric contact structures associated with different piezoelectric layer portions may be physically separated from each other.

According to various embodiments, a method of manufacturing an acoustic wave sensor is provided. The method may include: forming a piezoelectric layer of a piezoelectric material on a continuous membrane, and forming a plurality of electric contact structures in physical contact with a plurality of piezoelectric layer portions for electrically connecting the respective piezoelectric layer portions. Each piezoelectric layer portion may be equipped with at least two electric contact structures. Electric contact structures associated with different piezoelectric layer portions may be physically separated from each other.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

Figure 1:
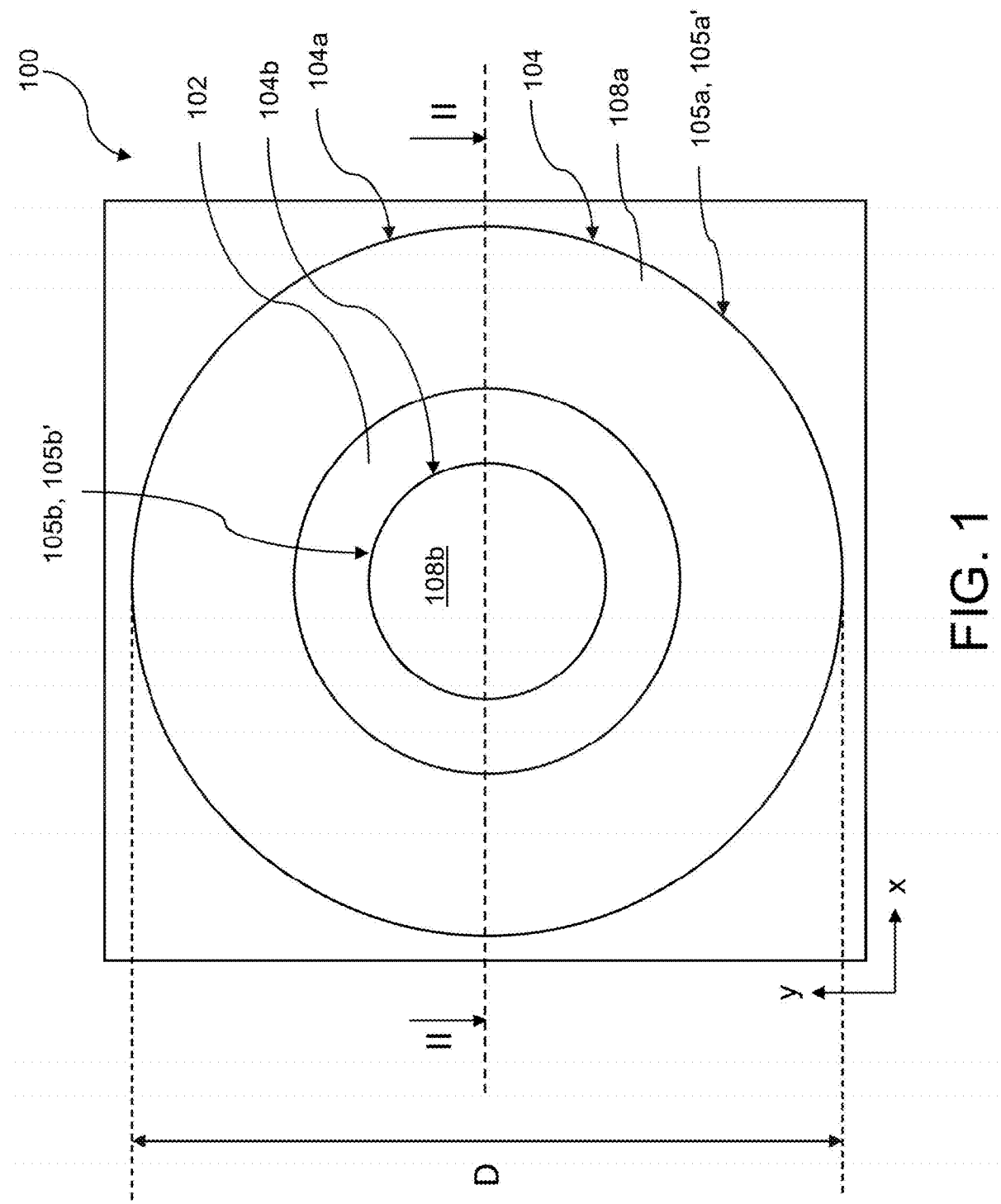
FIG. 1 shows a schematic plan view of an acoustic wave sensor.
Figure 2:
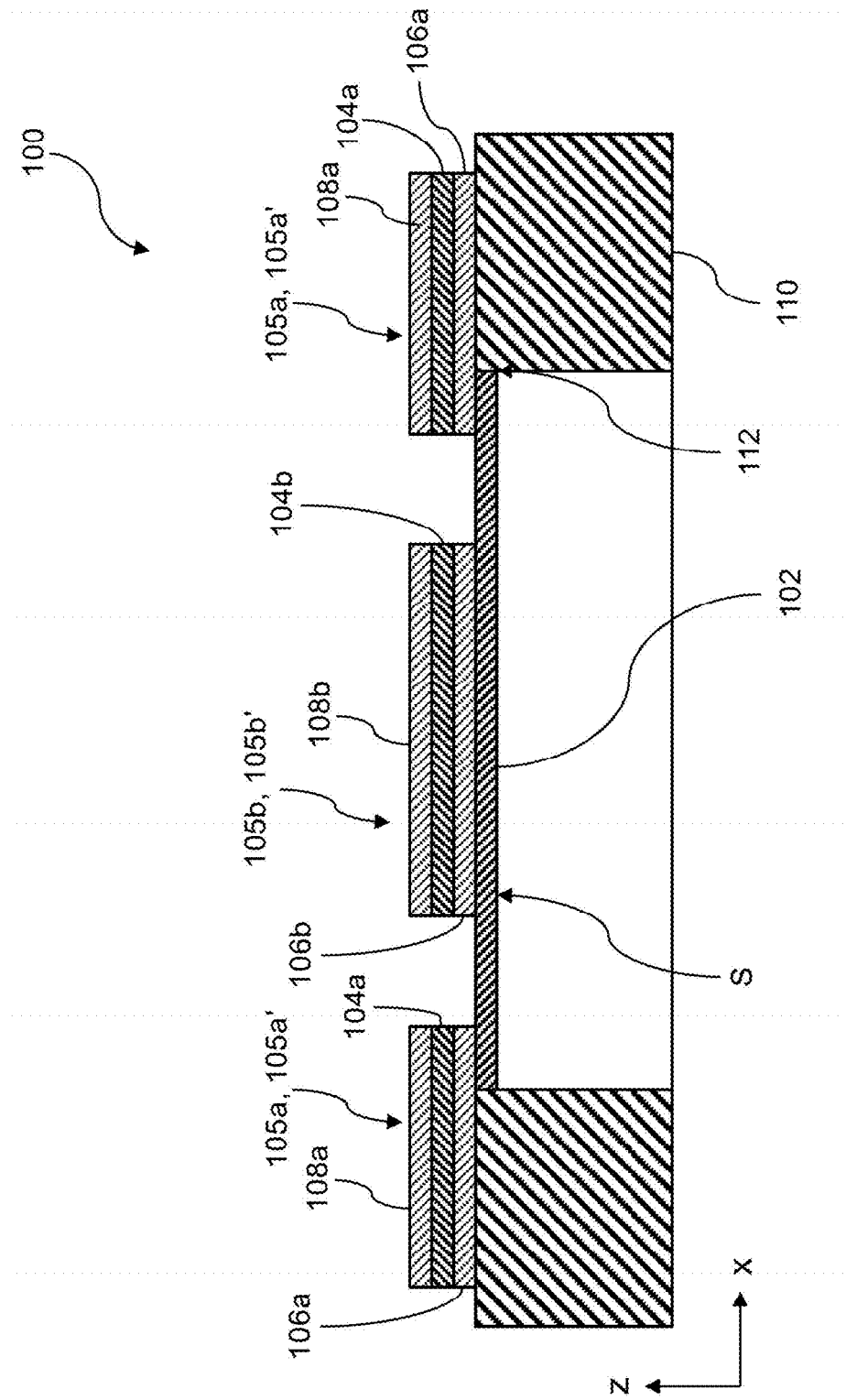
FIG. 2 shows a cross-sectional view of the acoustic wave sensor depicted in FIG. 1 according to line II-II shown in FIG. 1.

FIG. 1 shows a schematic plan view of an acoustic wave sensor 100. FIG. 2 shows a schematic cross-sectional view of the acoustic wave sensor 100 shown in FIG. 1 according to line II-II in FIG. 1.

The acoustic wave sensor 100 may include a continuous membrane 102 deflectable by acoustic waves to be detected, and a piezoelectric layer 104 provided on the membrane 102 and including a plurality of piezoelectric layer portions 104a, 104b respectively equipped with at least two individual electric contact structures 105a, 105a', 105b, 105b' in physical contact with the respective piezoelectric layer portions 104a, 104b, and configured to electrically connect the respective piezoelectric layer portions 104a, 104b. The plurality of piezoelectric layer portions 104a, 104b may be either formed as physically separated portions, as shown in FIGS. 1 and 2, or as integral portions of a continuous piezoelectric layer. In case the piezoelectric layer portions 104a, 104b are integral parts of a continuous piezoelectric layer they are defined by the respective electric contact structures 105a, 105a', 105b, 105b'.

A "continuous" membrane in the sense of the present application means that the membrane 102 is formed in one piece and, in particular, that the membrane 102 does not include cantilever-like portions that are displaceable independently of each other by the acoustic waves to be detected. The provision of a continuous membrane 102, therefore, contributes to a simple overall setup of the acoustic wave sensor 100.

The membrane 102 has a diameter D in a range of about 500 μm to about 2000 μm. Although the membrane 102 shown in FIG. 1 has a substantially circular shape, its shape is not limited thereto. Membranes with a rectangular or even a polygonal shape are also conceivable.

As shown in FIGS. 1 and 2, the membrane 102 may be planar. The membrane 102 may extend along a first main extension direction x and a second main extension direction y orthogonal to the first main extension direction x, and also along a third extension direction z orthogonal to both the first and second main extension directions x, y. The extension along the third extension direction z may be significantly smaller than the extension along the first and second main extension directions x and y. In the following, the third extension direction z will be referred to as a thickness direction z of the membrane 102. An axial direction may be defined as a direction parallel to the thickness direction z of the membrane 102.

The extension of the membrane 102 in the thickness direction z, i.e. its thickness, may be in a range of about 100 to about 1000 nm.

The piezoelectric layer 104 may be made of a material including at least one of aluminum nitride, zinc oxide, polyvinylidene fluoride, quartz, gallium arsenide, lithium niobate, PZT, PMN, barium titanate, strontium titanate, or any other suitable piezoelectric material. Its thickness may be in a range of about 100 to about 500 nm.

In operation, acoustic waves to be detected cause the membrane 102 and, hence, also the piezoelectric layer 104 to oscillate. By means of these acoustic wave-induced oscillations of the piezoelectric layer 104, an electric voltage is induced therein that can be read out by a suitable read-out circuit providing an electrical signal indicative of characteristics of the acoustic waves to be detected such as of the acoustic pressure associated therewith.

The acoustic pressure of voice-induced acoustic waves amounts to about 20 mPa. A typical deflection induced in a membrane 102 having the above-defined thickness by such a low acoustic pressure ranges in the sub-nm regime. The electric voltage induced in the piezoelectric layer 104 by such a deflection of the membrane 102 is less than 1 μV.

The vibrational characteristics of such a membrane 102 whose deflection amount is less than its thickness, will be subsequently referred to as a plate behaviour.

Such a plate behaviour is characterized in that different portions at the surface of the membrane 102 are under mechanical stresses with mutually opposite signs. This applies also to layers deposited on a membrane of this kind such as a piezoelectric layer. The plate behaviour is also characterized by stress gradients within the membrane in thickness direction. Consequently, in a piezoelectric layer covering all these portions and being electrically contacted by a one-piece continuous electric contact structure, electric voltages with different signs would be induced that would be shorted by the electric contact structure itself. This would significantly limit the net electric voltage induced in such a piezoelectric layer that may be output.

The net electric voltage can be enhanced as compared to such a continuous electric contact structure by equipping a plurality of piezoelectric layer portions 104a, 104b with at least two individual electric contact structures 105a, 105a', 105b, 105b' physically separated from each other and configured to electrically connect the respective piezoelectric layer portions 104a, 104b. Electric contact structures 105a, 105a', 105b, 105b' associated with different layer portions 104a, 104b are physically separated from each other. In this way, a short circuit of the plurality of piezoelectric layer portions 104a, 104b may be efficiently inhibited.

The piezoelectric layer portions 104a, 104b and, hence, the respective electric contact structures 105a, 105a', 105b, 105b', may be arranged on the membrane 102 at different positions that at a given time during an oscillation of the membrane 102 are under mechanical stresses with mutually opposite signs.

The electric voltages thus induced in the respective piezoelectric layer portions 104a, 104b can be separately read out by a suitable read-out circuit and subsequently fed into a differential amplifier. In this way, the net voltage induced in the piezoelectric layer 104 can be increased as compared to a piezoelectric layer whose induced voltage is read out via a continuous one-piece electric contact structure. In addition, due to the differential amplification of the signals originating from the respective piezoelectric layer portions 104a, 104b, the noise level can be significantly reduced as compared to a voltage signal read out by a one-piece continuous electric contact structure.

It is also conceivable to provide the membrane 102 with a thickness that is similar to or less than a typical acoustic wave-induced deflection of the membrane 102. Such an oscillation behaviour is referred to as a membrane behaviour.

In this case, substantially all portions of the membrane would be under mechanical stresses with the same sign. In such a sensor, a voltage amplification may be achieved by equipping the entire piezoelectric layer with an one-piece electric contact structure or by serially connecting the plurality of piezoelectric layer portions 104a, 104b. This may be achieved either by pressure contacts or by conducting paths provided on a portion of the sensor separate from the membrane and the piezoelectric layer. A noise reduction by a differential amplification would, however, not be possible with a such dimensioned membrane.

As indicated in FIGS. 1 and 2, the electric contact structures 105a, 105a', 105b, 105b' associated with the respective piezoelectric layer portions 104a, 104b may be respectively configured as pairs of electrodes 106a, 108a and 106b, 108b.

The respective pairs of electrodes 106a, 108a and 106b, 108b may include respective bottom electrodes 106a, 106b and respective top electrodes 108a, 108b. As shown in FIG. 2, the piezoelectric layer portions 104a, 104b may be interposed at least in part between the respective bottom electrodes 106a, 106b and the respective top electrodes 108a, 108b in a direction parallel to a thickness direction z of the membrane 102. Here, it should be noted that in case of piezoelectric layer portions configured as integral parts of a one-piece piezoelectric layer, the respective piezoelectric layer portions are defined by the respective bottom and top electrodes. More specifically, the piezoelectric layer portions are defined as those parts of the piezoelectric layer interposed between the respective bottom and top electrodes.

At least one or all of the electrodes 106a, 108a, 106b, 108b may have a thickness in a range of about 100 to about 300 nm. At least one or all of the electrodes 106a, 106b, 108a, 108b may be made of a material including at least one of aluminum, titanium, molybdenum, platinum, or any other suitable electrode material.

As shown in FIGS. 1 and 2, the acoustic wave sensor 100 may further include a holder 110 supporting the membrane 102. As shown in FIG. 2, the holder 110 may protrude beyond a surface S of the membrane 102 opposite to the piezoelectric layer 104. The holder 110 may be in physical contact with an outer periphery 112 of the membrane 102.

The holder 110 may be in continuous physical contact with more than 50% or even more than 75% of the outer periphery 112 of the membrane 102 in the circumferential direction thereof. In an exemplary embodiment, the holder 110 may be in continuous physical contact with the outer periphery 112 of the membrane 102 over substantially the entire outer circumference of the membrane 102. As indicated in FIG. 2, the holder 110 may have a substantially annular segment shape or a substantially annular shape.

The setup shown in FIGS. 1 and 2 with the membrane 102 supported basically over its entire outer periphery 112 by the holder 110, provides a substantially rotationally symmetric mechanical deformation behaviour of the membrane 102 by acoustic waves to be detected. In particular, in case of a plate behaviour of the membrane 102 described above, at a given time, those portions of the membrane 102 close to the outer periphery 112 thereof are under mechanical stresses with the same signs (e.g. either under tensile or compressive stress), and those portions of the membrane 102 close to its central area are under a mechanical stress with an opposite sign with respect to the portions of the membrane 102 close to the outer periphery 112 thereof.

To efficiently exploit this oscillation behaviour of the membrane 102, the piezoelectric layer 104 may include a radially outer piezoelectric layer portion 104a and a radially inner piezoelectric layer portion 104b respectively interposed between corresponding bottom electrodes 106a, 106b and top electrodes 108a, 108b. In this context, a radial direction is defined with respect to the axial direction defined above, i.e. as a direction orthogonal to the axial direction. In the following specification, the term "radially" with respect to the "inner piezoelectric layer portion" and the "outer piezoelectric layer portion" will be omitted.

As shown in FIGS. 1 and 2, the inner piezoelectric layer portion 104b may be positioned substantially at a central portion of the membrane 102 in the main extension plane defined by the first and second main extension directions x, y.

To efficiently exploit the rotationally symmetric oscillation behaviour of the membrane 102 in the setup shown in FIGS. 1 and 2, the outer and inner piezoelectric layer portions 104a, 104b may have a rotationally symmetric shape as indicated in FIGS. 1 and 2. In the sensor 100 shown in these figures, the inner piezoelectric layer portion 104b has a substantially circular shape and the outer piezoelectric layer portion 104a has a substantially annular shape. In this embodiment, the respective electrodes 106a, 108a, 106b, 108b are also provided with rotationally symmetric shapes corresponding to the individual shapes of the outer piezoelectric layer portion 104a and the inner piezoelectric layer portion 104b, respectively.

Starting from the setup shown in FIGS. 1 and 2, the sensitivity of the acoustic wave sensor 100 can be further increased by partitioning the outer bottom and top electrodes 106a, 108a into a plurality of bottom and top electrode segments 106a-1 to 106a-6, 108a-1 to 108a-6 consecutively arranged in the circumferential direction of the membrane 102 and sandwiching therebetween a plurality of respective outer piezoelectric layer portion segments 104a-1 to 104a-6, and by electrically connecting the respective piezoelectric layer portion segments 104a-1 to 104a-6 in series with each other via the respective electrode segments 106a-1 to 106a-6 and 108a-1 to 108a-6. Alternatively or additionally, the inner bottom and top electrodes 106b, 108b may be partitioned into a plurality of bottom and top electrode segments 106b-1 to 106b-6, 108b-1 to 108b-6 consecutively arranged in the circumferential direction of the membrane 102 and sandwiching therebetween a plurality of respective inner piezoelectric layer portion segments 104b-1 to 104b-6, and by electrically connecting the inner piezoelectric layer portion segments 104b-1 to 104b-6 in series with each other via the respective electrode segments 106b-1 to 106b-6 and 108b-1 to 108b-6.

Figure 3:
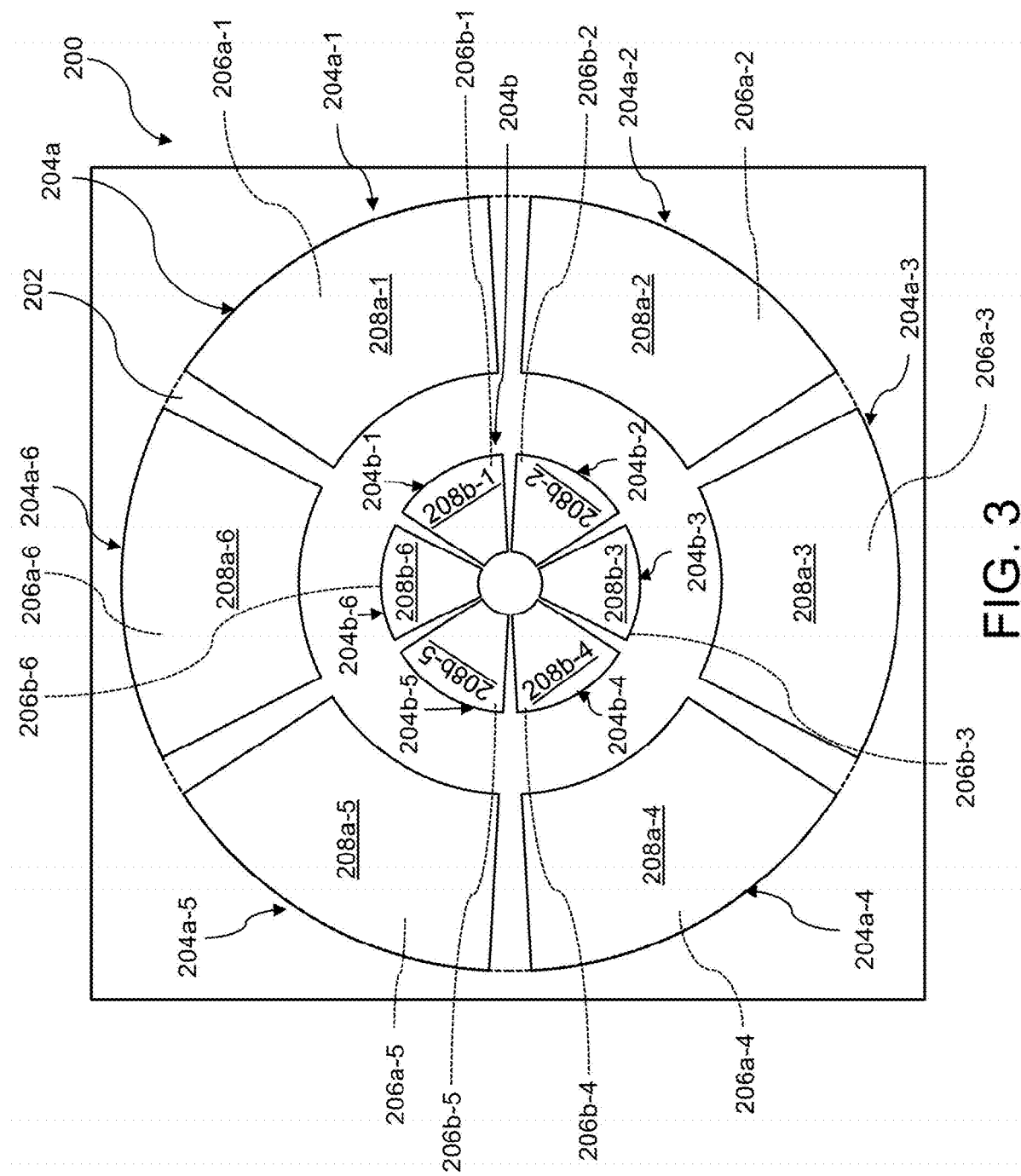
FIG. 3 shows a schematic plan view of a modified acoustic wave sensor.

An acoustic wave sensor 200 modified in this way is shown in FIG. 3. In FIG. 3, elements corresponding to elements of the acoustic wave sensor 100 shown in FIGS. 1 and 2 are denoted by the same reference numerals, however, enhanced by the number 100. The acoustic wave sensor 200 shown in FIG. 3 will be described only inasmuch as it differs from the acoustic wave sensor 100 shown in FIGS. 1 and 2.

As shown in FIG. 3, the outer piezoelectric layer portion 204a may include a plurality of piezoelectric layer portion segments 204a-1 to 204a-6 consecutively arranged in the circumferential direction of the membrane 202 and equipped with respective bottom electrode segments 206a-1 to 206a-6 and top electrode segments 208a-1 to 208a-6 by means of which they are serially connected to each other. The inner piezoelectric layer portion 204b may include a plurality of piezoelectric layer portion segments 204b-1 to 204b-6 consecutively arranged in the circumferential direction of the membrane 202 and equipped with respective bottom electrode segments 206b-1 to 206b-6 and top electrode segments 208b-1 to 208b-6 by means of which they are serially connected to each other. The respective piezoelectric layer portion segments 204a-1 to 204a-6, 204b-1 to 204b-6 may be either physically separated from each other, or integral parts of a continuous piezoelectric layer. Here, it should be noted that in case of piezoelectric layer portion segments configured as integral parts of a one-piece piezoelectric layer, the respective piezoelectric layer portion segments are defined by the respective bottom and top electrode segments. More specifically, the piezoelectric layer portion segments are defined as those parts of the piezoelectric layer interposed between respective bottom and top electrode segments. The circumferential direction is defined in this context relative to the axial direction defined above.

By means of the above-mentioned serial connection of the respective piezoelectric layer portions segments of the outer piezoelectric layer portion 204a and the inner piezoelectric layer portion 204b, the net voltage induced in a respective piezoelectric layer portion 204a, 204b can be further increased as compared to the respective piezoelectric layer portions 104a, 104b of the acoustic wave sensor 100 shown in FIGS. 1 and 2.

Figure 4:
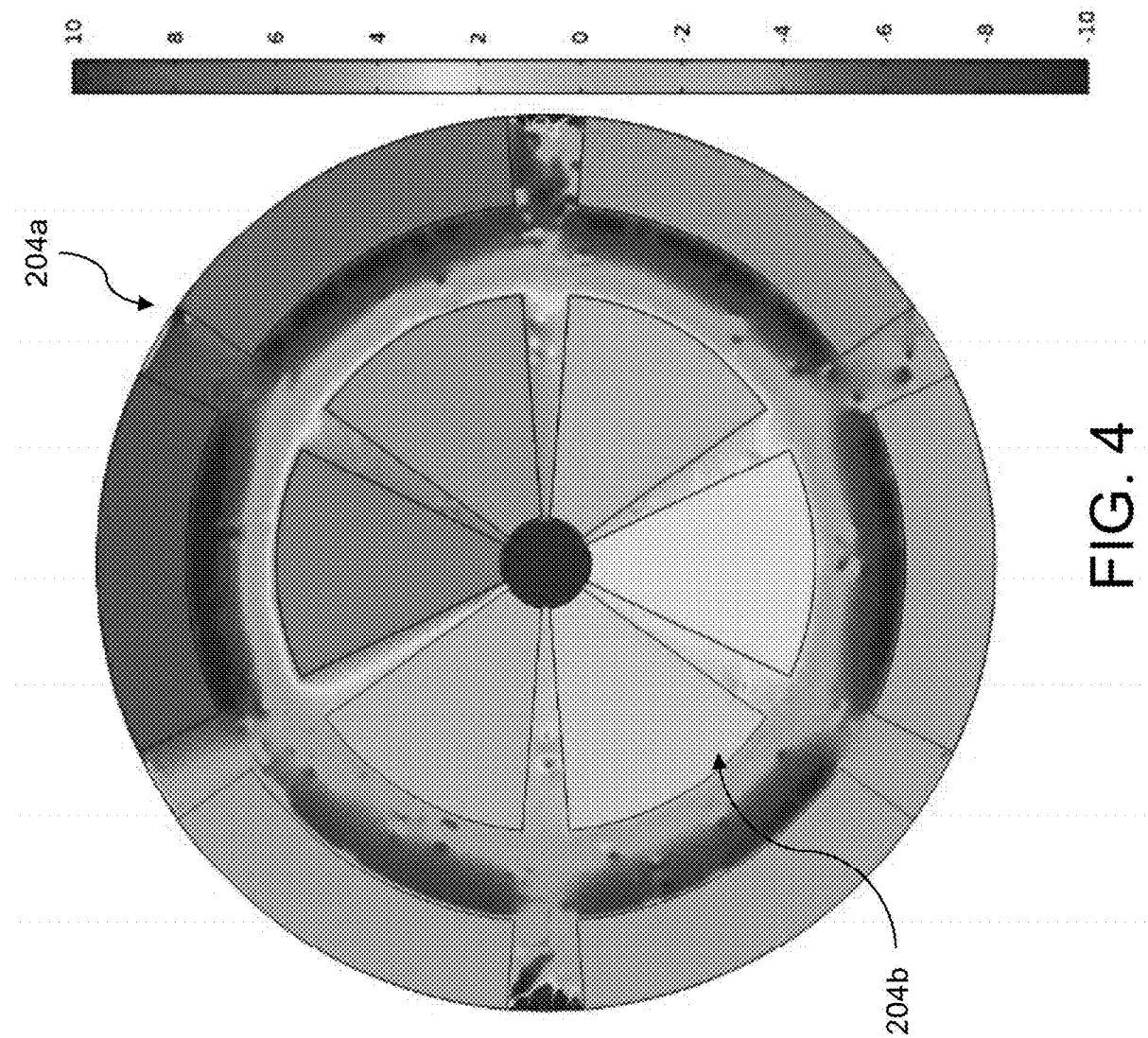
FIG. 4 shows the calculated induced voltage distribution in the piezoelectric layer portions of the acoustic wave sensor shown in FIG. 3.

The calculated induced voltage in an inner part of the outer piezoelectric layer portion segments 204a-1 to 204a-6 and in the inner piezoelectric layer portion segments 204b-1 to 204b-6 is shown in FIG. 4. As can clearly be seen in this figure, the voltages induced in the respective segments of the outer and inner piezoelectric layer portions 204a, 204b differ from each other. In addition, the polarity of the voltage induced in the inner piezoelectric layer portion segments is opposite to the polarity of the voltage induced in the outer piezoelectric layer portion segments.

Similar to the continuous piezoelectric layer portions 104a, 104b shown in FIGS. 1 and 2, the piezoelectric layer portion segments 204a-1 to 204a-6 of the outer piezoelectric layer portion 204a may be interposed between respective bottom electrode segments 206a-1 to 206a-6 and top electrode segments 208a-1 to 208a-6 in a direction parallel to the thickness direction of the membrane 202. Similarly, the piezoelectric layer portion segments 204b-1 to 204b-6 of the inner piezoelectric layer portion 204b may be interposed between respective bottom electrode segments 206b-1 to 206b-6 and top electrode segments 208b-1 to 208b-6 in a direction parallel to the thickness direction of the membrane 202.

Figure 5:
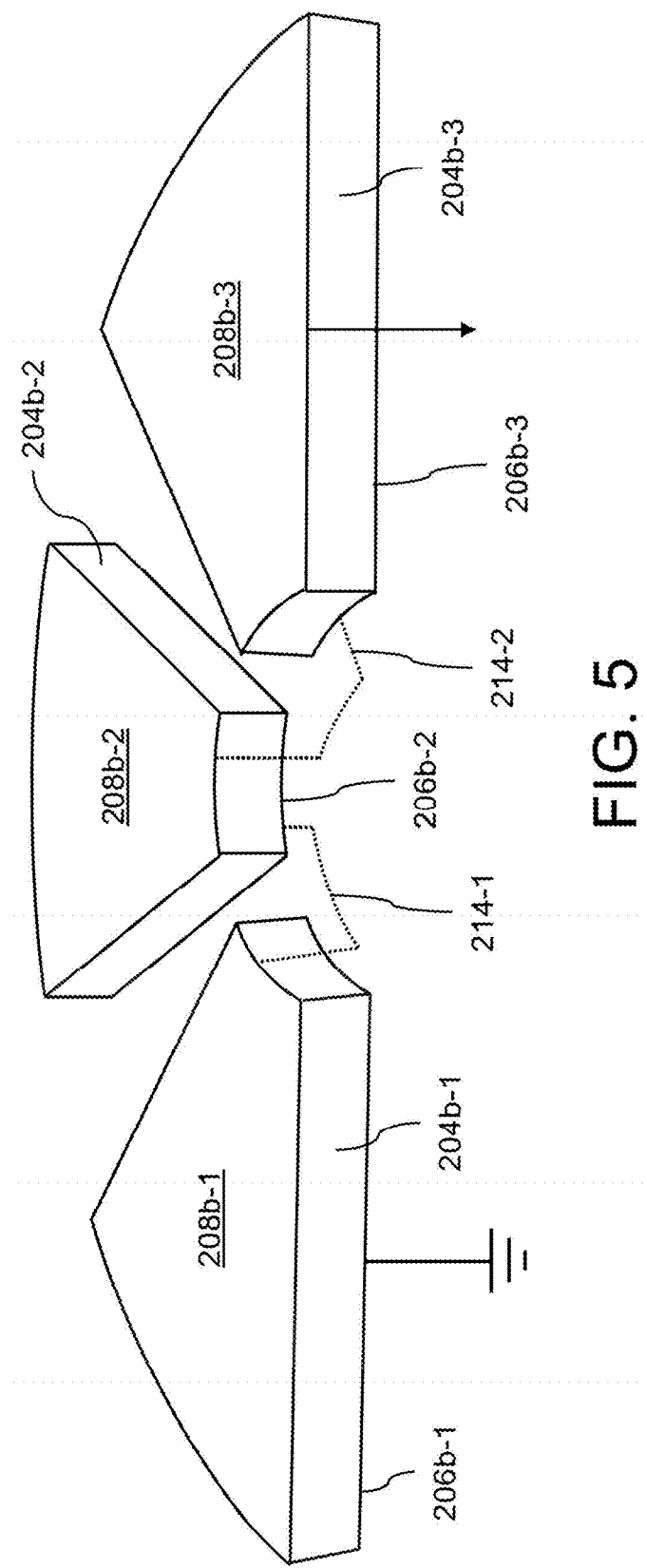
FIG. 5 shows a perspective view of some of the piezoelectric layer portion segments of the inner annular piezoelectric layer portion shown in FIG. 3.

The serial connection scheme of a given piezoelectric layer portion segment, e.g., of piezoelectric layer portion segment 204b-2 of the inner piezoelectric layer portion 204b positioned between two immediately adjacent piezoelectric layer portion segments 204b-1 and 204b-3 in the circumferential direction of the membrane 202 is schematically shown in FIG. 5.

As shown in this figure, the bottom electrode segment 206b-2 of the piezoelectric layer portion segment 204b-2 arranged between the two immediately adjacent piezoelectric layer portion segments 204b-1 and 204b-3 in the circumferential direction of the membrane 202 is electrically connected to a top electrode segment 208b-1 of one of the adjacent piezoelectric layer portion segments 204b-1 by a first connection 214-1, and the top electrode segment 208b-2 of the piezoelectric layer portion segment 204b-2 is electrically connected to a bottom electrode segment 206b-3 of the respective other one of the adjacent piezoelectric layer portion segments 204b-3 by a second connection 214-2. This serial connection scheme may be continued in the circumferential direction of the membrane 202, as indicated by the arrow in FIG. 5.

As further indicated in FIG. 5, the bottom electrode 206b-1 of the piezoelectric layer portion segment 204b-1 is connected to ground. In this connection scheme, an output line that may be fed into a read-out circuit may be connected to a top electrode of the sixth piezoelectric portion segment not shown in FIG. 5.

Figure 6B:
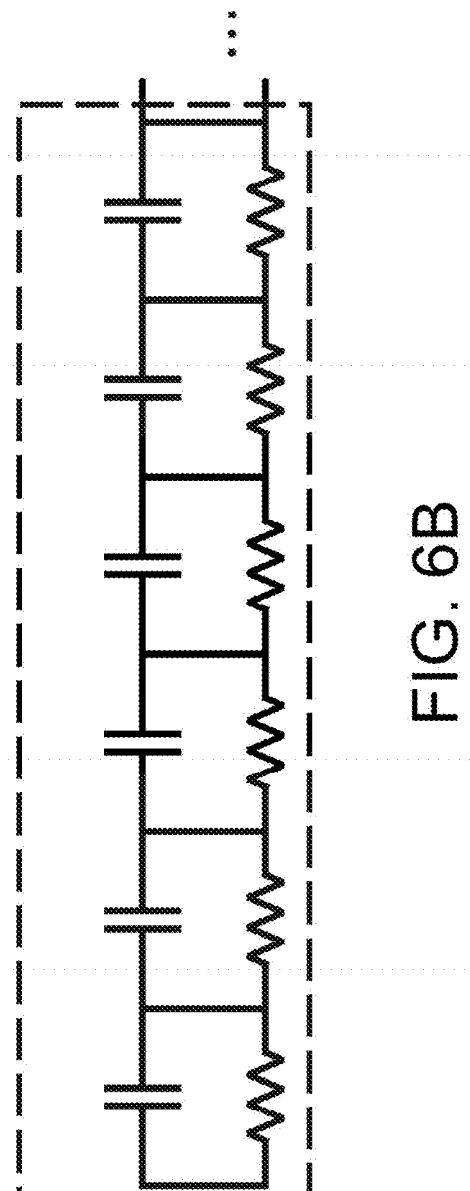
FIG. 6B shows the equivalent circuit diagram of a plurality of serially connected piezoelectric layer portion segments of the acoustic wave sensor shown in FIG. 3.
Figure 6A:
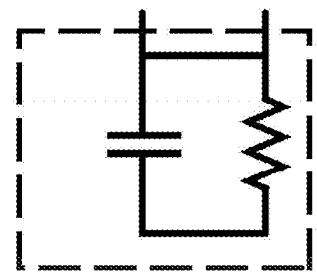
FIG. 6A shows the equivalent circuit diagram of a single piezoelectric layer portion segment of the acoustic wave sensor shown in FIG. 3.

An equivalent circuit diagram of the acoustic wave sensor 200 is shown in FIGS. 6A and 6B. As can clearly be seen in this figures, a single segment (N=1) interposed between respective electrode segments electrically corresponds to a capacitor connected in parallel to a resistor. In FIG. 6B, the equivalent circuit diagram for a sensor including six segments (N=6) is shown.

In theory, the net voltage induced in a plurality of serially connected piezoelectric layer portion segments, hereinafter referred to as stages, is the sum of the respective voltages induced in the individual stages. However, since due to the serial connection of the capacitances of the individual stages the overall capacitance is reduced by a factor of $1/N^2$, the number of stages cannot be infinitely increased.

Figure 7:
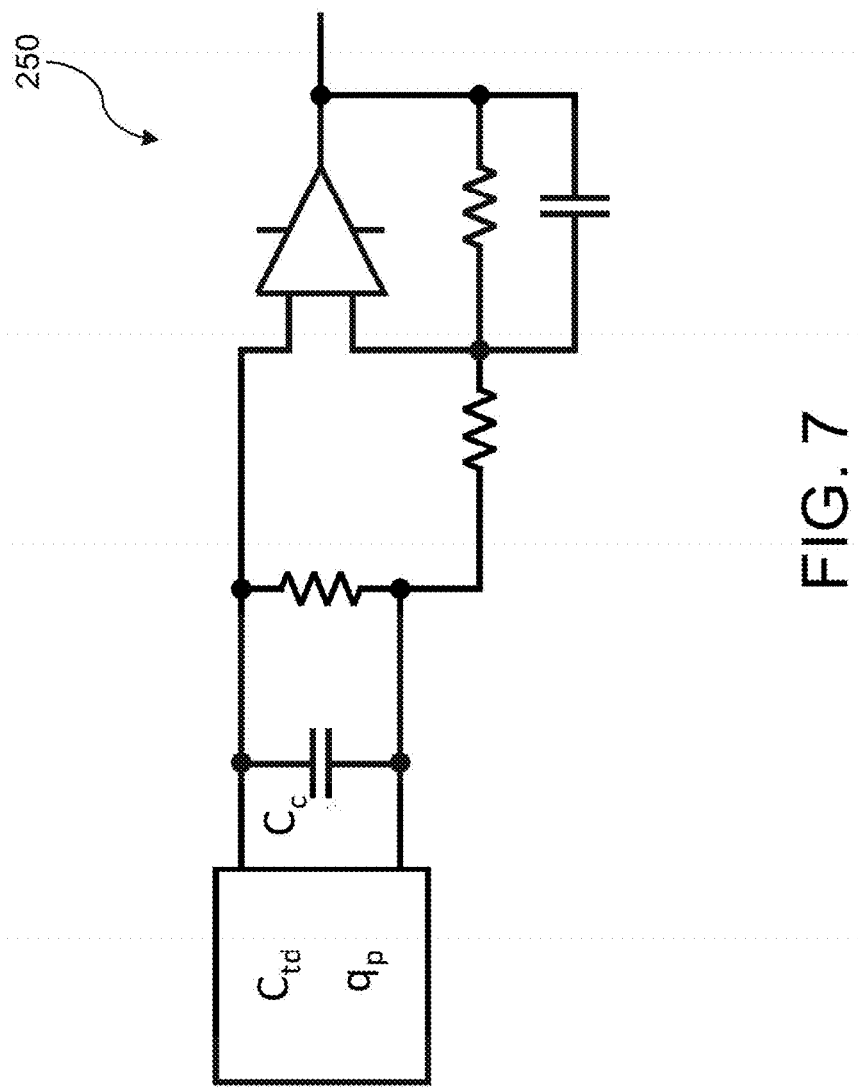
FIG. 7 shows the circuit diagram of a current amplifier usable in conjunction with an acoustic wave sensor.

FIG. 7 shows a circuit diagram of a current amplifier 250 that can be used in conjunction with one of the above-described acoustic wave sensors 100, 200. In FIG. 7 $q_p$ denotes the electric charge generated in a piezoelectric layer 104, 204. $C_{td}$ denotes the piezoelectric transducer capacity and $C_c$ the parasitic feed line capacity. The output voltage $V_0$ of the current amplifier 250 is given by $V_0 \propto q_p/(C_{td}+C_c)$. In this expression, only the impedance conversion is taken into account, i.e. no amplification is considered.

From this expression, it becomes obvious that with an increasing number N of stages, the output voltage $V_0$ becomes increasingly dependent on the parasitic feed line capacitance $C_c$.

Figure 8:
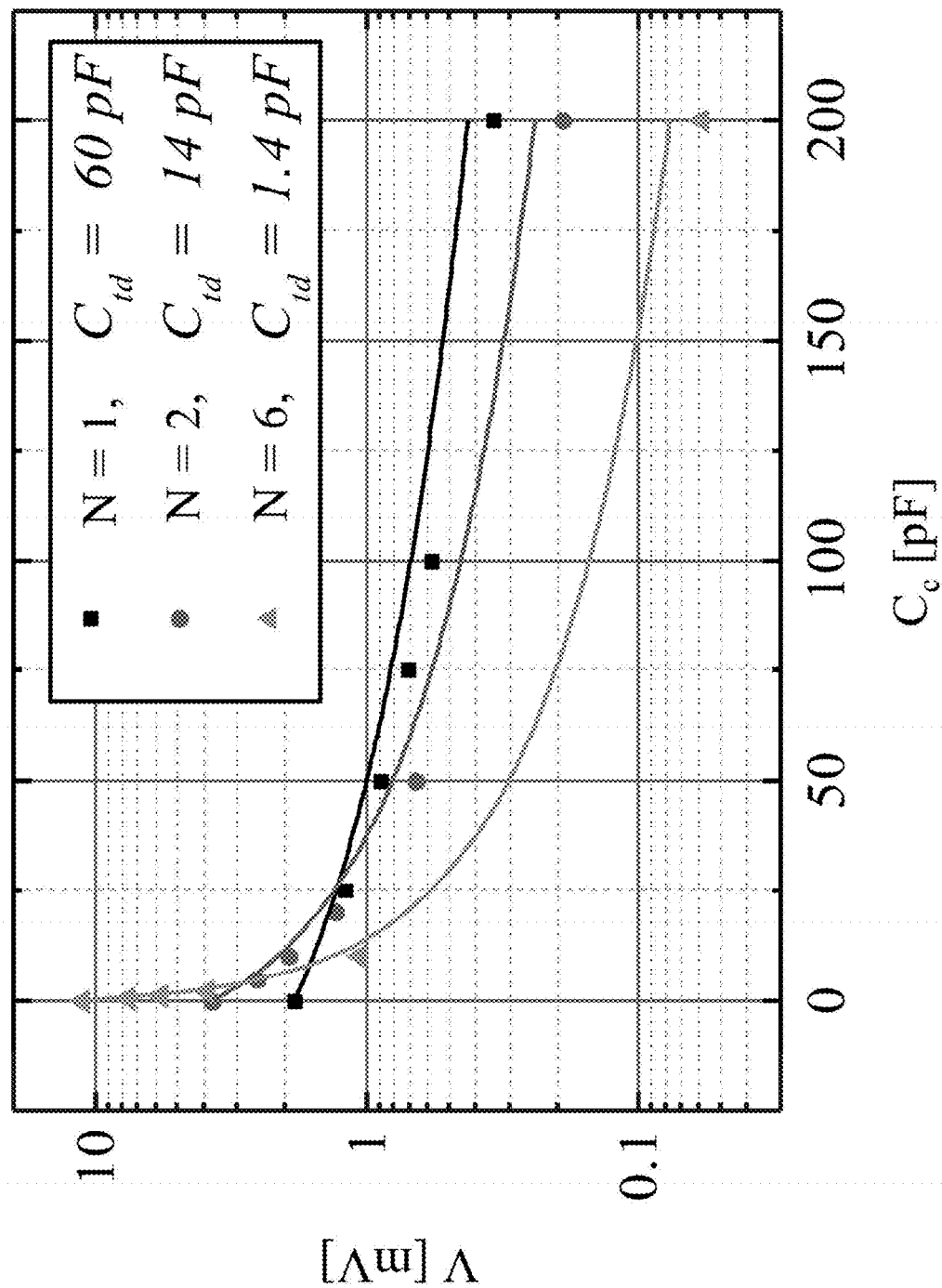
FIG. 8 shows the relationship between the voltage V induced in a piezoelectric layer portion with a single piezoelectric layer portion segment (N=1), two (N=2), and six piezoelectric layer portion segments (N=6) connected in series, and the parasitic feed line capacitance $C_c$.

The dependence of the output voltage on the parasitic feed line capacitance is shown in FIG. 8. As can clearly be seen in FIG. 8, the output voltage V increases linearly with the number of stages at low values of the feed line capacitance $C_c$. At high values of the parasitic feed line capacitance, e.g. of up to 200 pF, no increase in the output voltage can be achieved by increasing the stage number.

A simulation of a multi-stage setup without considering the parasitic feed line capacitance at an acoustic pressure of 1 mPa yields the expected linear dependence between the output voltage V and the number of stages N:

N=1: V=1.8 mV (−57.9 dBV)
N=2: V=3.7 mV (−51.6 dBV)
N=6: V=11.0 mV (−42.2 dBV).

The overall capacity of the system decreases as expected:

N=1: $C_c$=60 pF
N=2: $C_c$=14 pF
N=6: $C_c$=1.4 pF.

An acoustic wave sensor 100, 200 according to the present invention may be employed in a mobile device such as a mobile phone.

A method of manufacturing one of the above-described acoustic wave sensors 100, 200 may include:

forming a piezoelectric layer 104, 204 of a piezoelectric material on a continuous membrane 102, 202, and forming a plurality of electric contact structures in physical contact with a plurality of piezoelectric layer portions for electrically connecting the respective piezoelectric layer portions. Each piezoelectric layer portion may be equipped with at least two electric contact structures. Electric contact structures associated with different piezoelectric layer portions may be separated from each other.

The forming the piezoelectric layer 104, 204 may be performed by chemical vapor deposition (CVD) or physical vapor deposition (PVD) of a piezoelectric material such as aluminum nitride, zinc oxide, polyvinylidene fluoride, quartz, gallium arsenide, lithium niobate, PZT, PMN, barium titanate, strontium titanate, or any other suitable piezoelectric material directly onto the membrane 102, 202 or onto an intermediate layer such as an electrode layer.

The forming the piezoelectric layer 104, 204 may further include forming the piezoelectric layer 104, 204 with a plurality of piezoelectric layer portions 104a, 104b, 204a, 204b including an outer piezoelectric layer portion 104a, 204a and an inner piezoelectric layer portion 104b, 204b. The outer piezoelectric layer portion 104a, 204 is positioned closer to an outer periphery of the membrane 102, 202 than the inner piezoelectric layer portion 104b, 204b. The forming the plurality of piezoelectric layer portions 104a, 104b, 204a, 204b may be performed by sputtering or etching a continuous piezoelectric layer.

In an embodiment, the forming the piezoelectric layer may additionally include forming the piezoelectric layer 204 with a plurality of piezoelectric layer portions 204a, 204b that respectively include a plurality of piezoelectric layer portion segments 204a-1 to 204a-6 and 204b-1 to 204b-6 consecutively arranged in a circumferential direction of the membrane 202.

Some or all of the thus formed segments may be electrically connected in series to each other.

The forming the electric contact structures may further include forming a pair of electrodes 106a, 108a, 106b, 108b associated with a piezoelectric layer portion 104a, 104b for electrically connecting the piezoelectric layer portion 104a, 104b.

The forming the pair of electrodes 106a, 106b, 108a, 108b may include: forming a bottom electrode 106a, 106b and a top electrode 108a, 108b with a respective piezoelectric layer portion 104a, 104b interposed therebetween in a direction parallel to a thickness direction z of the membrane 102.

The forming the piezoelectric layer portion 104a, 104b interposed between the pair of electrodes 106a, 106b, 108a, 108b may include: forming a bottom electrode layer on the membrane 102, e.g. by chemical vapor deposition (CVD) or physical vapor deposition (PVD) of aluminum, titanium, molybdenum, platinum, or any other suitable electrode material directly onto the membrane 102, forming on top of the bottom electrode layer a piezoelectric layer 104, e.g. by chemical or physical vapor deposition, and on top of the piezoelectric layer 104 a top electrode layer, e.g. by chemical vapor deposition or physical vapor deposition of the above-mentioned materials.

The thus formed layer stack may be subsequently structured to form respective piezoelectric layer portions 104a, 104b interposed between respective bottom electrodes 106a, 106b and top electrodes 108a, 108b. The structuring of the layer stack may be performed, e.g., by sputtering or etching.

In case a piezoelectric layer portion 204a, 204b includes a plurality of piezoelectric layer portion segments 204a-1 to 204a-6 and 204b-1 to 204b-6, the forming the top and bottom electrodes may include forming respective bottom electrode segments 206a-1 to 206a-6 and 206b-1 to 206b-6, and top electrode segments 208a-1 to 208a-6 and 208b-1 to 208b-6 respectively associated with the piezoelectric layer portion segments 204a-1 to 204a-6 and 204b-1 to 204b-6. The bottom electrode segments 206a-1 to 206a-6 and 206b-1 to 206b-6 may be respectively interposed between the membrane 202 and the respective piezoelectric layer segments 204a-1 to 204a-6 and 204b-1 to 204b-6 in the direction parallel to the thickness direction of the membrane 202, and the piezoelectric layer portion segments 204a-1 to 204a-6 and 204b-1 to 204b-6 may be respectively interposed between the respective bottom electrode segments 206a-1 to 206a-6 and 206b-1 to 206b-6 and top electrode segments 208a-1 to 208a-6 and 208b-1 to 208b-6 in the direction parallel to the thickness direction of the membrane 202.

The manufacturing of the respective electrode segments can be performed similarly to the manufacturing of the bottom electrodes 106a, 106b and top electrodes 108a, 108b described above.

The method may further include: electrically connecting the bottom electrode segment 206b-2 of a piezoelectric layer portion segment 204b-2 arranged between two immediately adjacent piezoelectric layer portion segments 204b-1, 204b-3 in a circumferential direction of the membrane 202 to a top electrode segment 208b-1 of one of the adjacent piezoelectric layer portion segments 204b-1, and electrically connecting the top electrode segment 208b-2 of the piezoelectric layer portion segment 204b-2 to a bottom electrode segment 206b-3 of the respective other one of the adjacent piezoelectric layer portion segments 204b-3.

Additionally, the method may further include forming a holder 110 supporting the membrane 102. The holder 110 may be formed to contact an outer periphery 112 of the membrane 102.

The holder 110 may be formed to be in continuous physical contact with more than 50% or more than 75% of the outer periphery 112 of the membrane 102 in the circumferential direction thereof, or even with the entire outer periphery 112 of the membrane 102 in the circumferential direction thereof.

The holder 110 may be formed with a substantially annular segment shape or a substantially annular shape.

The holder 110 may be formed independently of the membrane 102. Alternatively, the membrane 102 and the holder 110 may be formed from a blank by etching. More specifically, a blank may be provided on which the piezoelectric layer and the plurality of electric contact structures are formed. After the forming of the piezoelectric layer and the plurality of electric contact structures, a part of the blank, e.g. a central part on a side of the blank opposite to the piezoelectric layer, may be removed to integrally form the membrane 102 and the holder 110. The removal of a part of the blank may be performed by etching.

Figure 9:
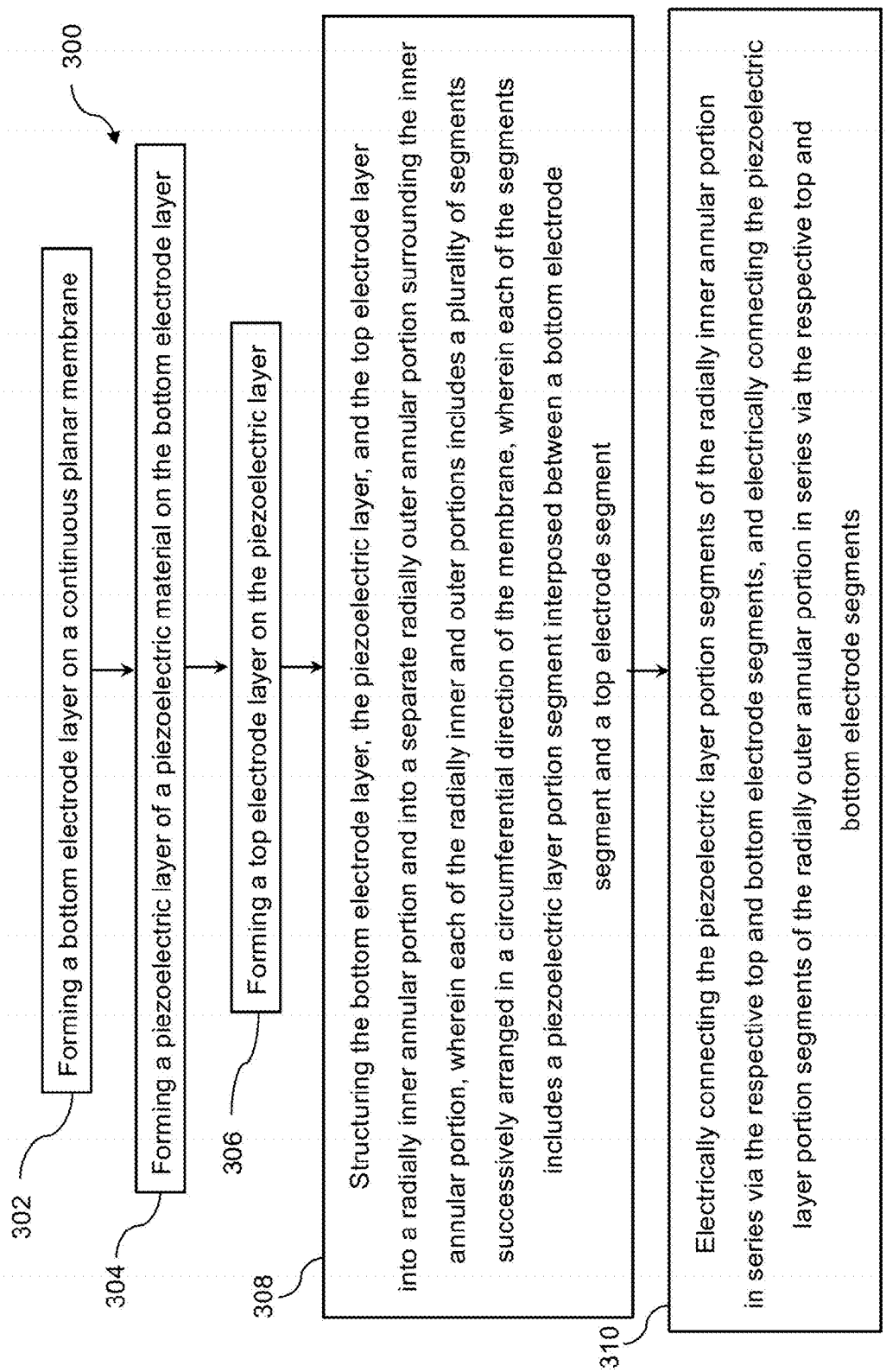
FIG. 9 shows a flow diagram of an exemplary method of manufacturing an acoustic wave sensor.

FIG. 9 shows a flow diagram of an exemplary method 300 of manufacturing an acoustic wave sensor 200. The method may include:

forming a bottom electrode layer on a continuous planar membrane 202 (302);

forming a piezoelectric layer of a piezoelectric material on the bottom electrode layer (304);

forming a top electrode layer on the piezoelectric layer (306);

structuring the bottom electrode layer, the piezoelectric layer, and the top electrode layer into a radially inner annular portion and into a separate radially outer annular portion surrounding the inner annular portion with each of the radially inner and outer portions including a plurality of segments consecutively arranged in a circumferential direction of the membrane 202, and with each of the segments including a piezoelectric layer portion segment 204a-1 to 204a-6 and 204b-1 to 204b-6 interposed between a bottom electrode segment 206a-1 to 206a-6 and 206b-1 and 206b-6 and a top electrode segment 208a-1 to 208a-6 and 208b-1 and 208b-6 (308); and electrically connecting the piezoelectric layer portion segments 204b-1 to 204b-6 of the radially inner annular portion in series via the respective top electrode segments 208b-1 and 208b-6 and bottom electrode segments 206b-1 and 206b-6, and electrically connecting the piezoelectric layer portion segments 204a-1 to 204a-6 of the radially outer annular portion in series via the respective top electrode segments 208a-1 to 208a-6 and bottom electrode segments 206a-1 to 206a-6 (310).

In the following, various aspects of this disclosure will be illustrated.

Example 1 is an acoustic wave sensor. The acoustic wave sensor may include: a continuous membrane deflectable by acoustic waves to be detected, and a piezoelectric layer provided on the membrane and including a plurality of piezoelectric layer portions respectively equipped with at least two individual electric contact structures configured to electrically connect the respective piezoelectric layer portions. Electric contact structures associated with different piezoelectric layer portions may be physically separated from each other. The piezoelectric layer portions may be either physically separated from each other, or integral parts of a continuous single-piece piezoelectric layer.

In Example 2, the subject matter of Example 1 can optionally further include that the plurality of piezoelectric layer portions includes an inner piezoelectric layer portion and an outer piezoelectric layer portion. The outer piezoelectric layer portion may be positioned closer to an outer periphery of the membrane than the inner piezoelectric layer portion.

In Example 3, the subject matter of Example 2 can optionally further include that the inner piezoelectric layer portion is positioned substantially at a central portion of the membrane.

In Example 4, the subject matter of any one of Examples 1 to 3 can optionally further include that at least one or both of the inner and outer piezoelectric layer portions have a rotationally symmetric shape.

In Example 5, the subject matter of any one of Examples 1 to 4 can optionally further include that at least one or both of the inner and outer piezoelectric layer portions have an annular shape.

In Example 6, the subject matter of any one of Examples 1 to 5 can optionally further include that at least one or all of the piezoelectric layer portions includes/include a plurality of piezoelectric layer portion segments consecutively arranged in a circumferential direction of the membrane.

In Example 7, the subject matter of any one of Examples 1 to 6 can optionally further include that at least two of the piezoelectric layer portions are electrically connected in series.

In Example 8, the subject matter of any one of Examples 6 or 7 can optionally further include that at least two or all of the plurality of piezoelectric layer portion segments are electrically connected in series.

In Example 9, the subject matter of any one of Examples 1 to 8 can optionally further include that the electric contact structures of at least one piezoelectric layer portion includes a pair of electrodes associated with the piezoelectric layer portion for electrically connecting the piezoelectric layer portion.

In Example 10, the subject matter of Example 9 can optionally further include that the pair of electrodes includes a top electrode and a bottom electrode. The piezoelectric layer portion with which the top and bottom electrodes are associated may be interposed at least in part between the top and bottom electrodes in a direction parallel to a thickness direction of the membrane.

In Example 11, the subject matter of Examples 6 and 10 can optionally further include that the top and bottom electrodes include top and bottom electrode segments, respectively, which are respectively associated with the piezoelectric layer portion segments. The piezoelectric layer portion segments may be respectively interposed between respective top electrode segments and bottom electrode segments in a direction parallel to the thickness direction of the membrane.

In Example 12, the subject matter of Examples 8 and 11 can optionally further include that the bottom electrode segment of a piezoelectric layer portion segment arranged between two immediately adjacent piezoelectric layer portion segments in the circumferential direction of the membrane is electrically connected to a top electrode segment of one of the adjacent piezoelectric layer portion segments, and the top electrode segment of the piezoelectric layer portion segment is electrically connected to a bottom electrode segment of the respective other one of the adjacent piezoelectric layer portion segments.

In Example 13, the subject matter of any one of Examples 1 to 12 can optionally further include a holder supporting the membrane.

In Example 14, the subject matter of Example 13 can optionally further include that the holder protrudes beyond a surface of the membrane opposite to the piezoelectric layer.

In Example 15, the subject matter of Example 14 can optionally further include that the holder is in physical contact with an outer periphery of the membrane.

In Example 16, the subject matter of Example 15 can optionally further include that the holder is in continuous physical contact with more than 50% of the outer periphery of the membrane in the circumferential direction of the membrane.

In Example 17, the subject matter of Example 16 can optionally further include that the holder is in continuous physical contact with more than 75% of the outer periphery of the membrane in the circumferential direction of the membrane.

In Example 18, the subject matter of Example 17 can optionally further include that the holder is in continuous physical contact with the entire outer circumference of the membrane.

In Example 19, the subject matter of any one of Examples 15 to 18 can optionally further include that the holder has a substantially annular segment shape or a substantially annular shape.

In Example 20, the subject matter of any one of Examples 1 to 19 can optionally further include that the membrane has a diameter in a range of about 500 to about 2000 μm.

In Example 21, the subject matter of any one of Examples 1 to 20 can optionally further include that the membrane has a thickness in a range of about 100 to about 1000 nm.

In Example 22, the subject matter of any one of Examples 1 to 21 can optionally further include that the piezoelectric layer has a thickness in a range of about 100 to about 500 nm.

In Example 23, the subject matter of any one of Examples 9 to 22 can optionally further include that at least one of the electrodes or all electrodes has/have a thickness in a range of about 100 to about 300 nm.

In Example 24, the subject matter of any one of Examples 1 to 23 can optionally further include that the piezoelectric layer is made of a material including at least one of aluminum nitride, zinc oxide, polyvinylidene fluoride, quartz, gallium arsenide, lithium niobate, PZT, PMN, barium titanate, strontium titanate, or any other suitable piezoelectric material.

In Example 25, the subject matter of any one of Examples 9 to 24 can optionally further include that at least one electrode or all electrodes is/are made of a material including at least one of aluminum, titanium, molybdenum, platinum, or any other suitable electrode material.

In Example 26, the subject matter of any one of Examples 1 to 25 can optionally further include that the membrane is substantially planar.

Example 27 is a method of manufacturing an acoustic wave sensor of any one of Examples 1 to 26. The method may include: forming a piezoelectric layer of a piezoelectric material on a continuous membrane, and forming a plurality of electric contact structures in physical contact with a plurality of piezoelectric layer portions for electrically connecting the respective piezoelectric layer portions. Each piezoelectric layer portion may be equipped with at least two electric contact structures. Electric contact structures associated with different piezoelectric layer portions may be physically separated from each other.

In Example 28, the subject matter of Example 27 can optionally further include that the forming the piezoelectric layer includes forming the piezoelectric layer with a plurality of piezoelectric layer portions including a radially inner piezoelectric layer portion and a radially outer piezoelectric layer portion. The outer piezoelectric layer portion may be positioned closer to an outer periphery of the membrane than the inner piezoelectric layer portion.

In Example 29, the subject matter of any one of Examples 27 or 28 can optionally further include that the forming the piezoelectric layer includes forming the piezoelectric layer with a plurality of piezoelectric layer portions at least one of which or all of which includes/include a plurality of piezoelectric layer portion segments consecutively arranged in a circumferential direction of the membrane.

In Example 30, the subject matter of any one of Examples 27 to 29 can optionally further include electrically connecting in series at least two or all of the piezoelectric layer portions.

In Example 31, the subject matter of Examples 29 or 30 can optionally further include electrically connecting in series at least two or all of the plurality of piezoelectric layer portion segments of a piezoelectric layer portion.

In Example 32, the subject matter of any one of Examples 27 to 31 can optionally further include that the forming the electric contact structures includes forming a pair of electrodes associated with a piezoelectric layer portion for electrically connecting the piezoelectric layer portion.

In Example 33, the subject matter of Example 32 can optionally further include that the forming of a pair of electrodes includes forming a bottom electrode and a top electrode. The bottom electrode may be interposed between the membrane and the piezoelectric layer portion in a direction parallel to a thickness direction of the membrane and the piezoelectric layer portion may be interposed between the bottom electrode and the top electrode in the direction parallel to the thickness direction of the membrane.

In Example 34, the subject matter of Examples 29 and 33 can optionally further include that the forming the top and bottom electrodes includes forming respective bottom and top electrode segments respectively associated with the piezoelectric layer portion segments. The bottom electrode segments may be respectively interposed between the membrane and the respective piezoelectric layer segments in the direction parallel to the thickness direction of the membrane, and the piezoelectric layer portion segments may be respectively interposed between the respective bottom electrode segments and top electrode segments in the direction parallel to the thickness direction of the membrane.

In Example 35, the subject matter of Examples 31 and 34 can optionally further include electrically connecting the bottom electrode segment of a piezoelectric layer portion segment arranged between two immediately adjacent piezoelectric layer portion segments in a circumferential direction of the membrane to a top electrode segment of one of the adjacent piezoelectric layer portion segments, and electrically connecting the top electrode segment of the piezoelectric layer portion segment to a bottom electrode segment of the respective other one of the adjacent piezoelectric layer portion segments.

In Example 36, the subject matter of any one of Examples 27 to 35 can optionally further include forming a holder supporting the membrane.

In Example 37, the subject matter of Example 36 can optionally further include that the holder is formed to physically contact an outer periphery of the membrane.

In Example 38, the subject matter of Example 37 can optionally further include that the holder is formed to be in continuous physical contact with more than 50% of the outer periphery of the membrane in the circumferential direction of the membrane.

In Example 39, the subject matter of Example 38 can optionally further include that the holder is formed to be in continuous physical contact with more than 75% of the outer periphery of the membrane in the circumferential direction of the membrane.

In Example 40, the subject matter of Example 39 can optionally further include that the holder is formed to be in physical contact with the entire outer periphery of the membrane in the circumferential direction of the membrane.

In Example 41, the subject matter of any one of Examples 36 to 40 can optionally further include that the holder has a substantially annular segment shape or a substantially annular shape.

In Example 42, the subject matter of any one of Examples 27 to 41 can optionally further include that the membrane is substantially planar.

Example 43 is a device for detecting acoustic waves including an acoustic wave sensor of any one of Examples 1 to 26.

In Example 44, the subject matter of Example 43 can optionally further include that the device is configured as a mobile device.

In Example 45, the subject matter of Example 44 can optionally further include that the mobile device is configured as a mobile phone.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An acoustic wave sensor, comprising:
    a continuous membrane deflectable by acoustic waves to be detected; and
    a piezoelectric layer provided on the membrane and comprising a plurality of piezoelectric layer portions respectively equipped with at least two individual electric contact structures configured to electrically connect the respective piezoelectric layer portions, wherein the electric contact structures associated with different piezoelectric layer portions are separated from each other,
    wherein the plurality of piezoelectric layer portions comprises an inner piezoelectric layer portion and an outer piezoelectric layer portion, wherein the outer piezoelectric layer portion is positioned closer to an outer periphery of the membrane than the inner piezoelectric layer portion, and
    wherein the inner and outer piezoelectric layer portions each comprise a plurality of piezoelectric layer portion segments consecutively arranged in a circumferential direction of the membrane,
    wherein the electric contact structures associated with each of the piezoelectric layer portions comprising a top electrode and a bottom electrode associated with the piezoelectric layer portion for electrically connecting the piezoelectric layer portion,
wherein the top and bottom electrodes comprise top and bottom electrode segments respectively associated with the piezoelectric layer portion segments, wherein the piezoelectric layer portion segments are respectively interposed between the respective top electrode segment and the bottom electrode segment in a direction parallel to the thickness direction of the membrane, and wherein for each piezoelectric layer portion segment, sidewalls of the top electrode segment, the bottom electrode segment and the piezoelectric layer are coplanar.

2. The acoustic wave sensor of claim 1,
wherein at least one or both of the inner and outer piezoelectric layer portions have a rotationally symmetric shape.

3. The acoustic wave sensor of claim 1,
wherein at least one or both of the inner and outer piezoelectric layer portions have an annular shape.

4. The acoustic wave sensor of claim 1,
wherein at least two of the piezoelectric layer portions are electrically connected in series; and/or
wherein at least two or all of the plurality of piezoelectric layer portion segments are electrically connected in series.

5. The acoustic wave sensor of claim 1,
wherein the bottom electrode segment of a piezoelectric layer portion segment arranged between two immediately adjacent piezoelectric layer portion segments in the circumferential direction of the membrane is electrically connected to a top electrode segment of one of the adjacent piezoelectric layer portion segments, and the top electrode segment of the piezoelectric layer portion segment is electrically connected to a bottom electrode segment of the respective other one of the adjacent piezoelectric layer portion segments.

6. The acoustic wave sensor of claim 5, further comprising:
a holder supporting the membrane.

7. The acoustic wave sensor of claim 6,
wherein the holder protrudes beyond a surface of the membrane opposite to the piezoelectric layer.

8. The acoustic wave sensor of claim 7,
wherein the holder is in physical contact with a sidewall at an outer periphery of the membrane.

9. The acoustic wave sensor of claim 8,
wherein the holder has a substantially annular segment shape or a substantially annular shape.

10. The acoustic wave sensor of claim 1,
wherein the membrane has a diameter in a range of about 500 to about 2000 µm; and/or
wherein the membrane has a thickness in a range of about 100 to about 1000 nm.

11. The acoustic wave sensor of claim 1,
wherein the piezoelectric layer has a thickness in a range of about 100 to about 500 nm.

12. The acoustic wave sensor of claim 1,
wherein at least one of the electrodes or all the electrodes has/have a thickness in a range of about 100 to about 300 nm.

13. A method of manufacturing an acoustic wave sensor, the method comprising:
forming a piezoelectric layer of a piezoelectric material on a continuous membrane; and
forming a plurality of electric contact structures in physical contact with a plurality of piezoelectric layer portions for electrically connecting the respective piezoelectric layer portions, wherein each piezoelectric layer portion is equipped with at least two electric contact structures and wherein the electric contact structures associated with different piezoelectric layer portions are separated from each other,
wherein the forming the piezoelectric layer comprises forming the piezoelectric layer with a plurality of piezoelectric layer portions comprising an inner piezoelectric layer portion and an outer piezoelectric layer portion, wherein the outer piezoelectric layer portion is positioned closer to an outer periphery of the membrane than the inner piezoelectric layer portion,
wherein the forming the piezoelectric layer comprises forming the piezoelectric layer with a plurality of piezoelectric layer portions so that the inner piezoelectric layer portion and the outer piezoelectric layer portion each comprises a plurality of piezoelectric layer portion segments consecutively arranged in a circumferential direction of the membrane,
wherein the forming the electric contact structures comprises respectively forming a top electrode and a bottom electrode for each piezoelectric layer portion for electrically connecting the piezoelectric layer portions, wherein each bottom electrode is formed above the membrane so as to be interposed between the membrane and the piezoelectric layer portion in a direction parallel to a thickness direction of the membrane and wherein each piezoelectric layer portion is interposed between the respective bottom electrode and the top electrode in the direction parallel to the thickness direction of the membrane so that sidewalls of the piezoelectric layer portion and sidewalls of the top and bottom electrode are coplanar.

14. The method of claim 13, further comprising:
electrically connecting in series at least two or all of the piezoelectric layer portions; and/or
electrically connecting in series at least two or all of the plurality of piezoelectric layer portion segments of a piezoelectric layer portion.

15. The method of claim 13, further comprising:
forming a holder supporting the membrane;
wherein the holder is formed to physically contact an outer periphery of the membrane.

16. A device for detecting acoustic waves comprising an acoustic wave sensor, wherein the acoustic wave sensor comprises
a continuous membrane deflectable by acoustic waves to be detected; and
a piezoelectric layer provided on the membrane and comprising a plurality of piezoelectric layer portions respectively equipped with at least two individual electric contact structures configured to electrically connect the respective piezoelectric layer portions, wherein the electric contact structures associated with different piezoelectric layer portions are separated from each other,
wherein the plurality of piezoelectric layer portions comprises an inner piezoelectric layer portion and an outer piezoelectric layer portion, wherein the outer piezoelectric layer portion is positioned closer to an outer periphery of the membrane than the inner piezoelectric layer portion,
wherein the forming the piezoelectric layer comprises forming the piezoelectric layer with a plurality of piezoelectric layer portions so that the inner piezoelectric layer portion and the outer piezoelectric layer portion each comprises a plurality of piezoelectric layer portion segments consecutively arranged in a circumferential direction of the membrane, a top electrode and a bottom electrode segment pair for each of the plurality of piezoelectric layer portion segments, wherein each of the plurality of piezoelectric layer portion segments is disposed between the top electrode and bottom electrode segment pair, and wherein for each of the plurality of piezoelectric segments, the sidewalls of the top electrode, the bottom electrode, and the piezoelectric layer are coplanar.

17. The device of claim 16,
configured as a mobile device.

18. The acoustic wave sensor of claim 1,
wherein the inner piezoelectric layer portion is positioned substantially at a central portion of the membrane.

19. The acoustic wave sensor of claim 1, wherein plurality of piezoelectric layer portion segments are non-contiguous and physically separated from each other.

20. The acoustic wave sensor of claim 1, wherein the bottom electrode layer is at least partially formed on and above the continuous planar membrane, so that the bottom electrode layer is interposed between the continuous planar membrane and the piezoelectric layer.

21. The acoustic wave sensor of claim 1, wherein the plurality of piezoelectric layer portion segments of the inner piezoelectric layer portion have an identical shape and size.

\* \* \* \* \*